United States Patent
Nakatani et al.

(10) Patent No.: US 8,921,446 B2
(45) Date of Patent: Dec. 30, 2014

(54) PHOTOCURABLE MATERIAL FOR SEALING, SEALING METHOD, SEALING MATERIAL, AND HOUSING USING SAID SEALING MATERIAL

(71) Applicant: Nitta Gelatin Inc., Osaka (JP)

(72) Inventors: Hiroyuki Nakatani, Osaka (JP); Seiki Ueno, Osaka (JP); Kazuyoshi Sekita, Osaka (JP)

(73) Assignee: Nitta Gelatin Inc., Osaka (JP)

( * ) Notice: Subject to any disclaimer, the term of this patent is extended or adjusted under 35 U.S.C. 154(b) by 0 days.

(21) Appl. No.: 13/946,524

(22) Filed: Jul. 19, 2013

(65) Prior Publication Data

US 2013/0303651 A1    Nov. 14, 2013

Related U.S. Application Data

(63) Continuation-in-part of application No. PCT/JP2012/078297, filed on Nov. 1, 2012.

(30) Foreign Application Priority Data

Nov. 29, 2011 (JP) ................. 2011-260330

(51) Int. Cl.
| | | |
|---|---|---|
| C03C 25/10 | (2006.01) |
| C08G 18/67 | (2006.01) |
| C08F 2/46 | (2006.01) |
| C08G 61/04 | (2006.01) |
| H01L 23/29 | (2006.01) |
| C08L 51/08 | (2006.01) |
| C09K 3/10 | (2006.01) |
| C08K 5/00 | (2006.01) |
| C08K 5/37 | (2006.01) |

(52) U.S. Cl.
CPC ............ *H01L 23/293* (2013.01); *C08L 51/08* (2013.01); *C09K 3/1012* (2013.01); *C08K 5/0025* (2013.01); *C08K 5/37* (2013.01); *C09K 2003/1062* (2013.01); *C09K 2200/0625* (2013.01)
USPC ................. 522/96; 522/90; 522/113; 522/1; 520/1

(58) Field of Classification Search
CPC ............ C08K 5/29; C08K 2/37; C08L 51/08; C09K 3/1012; C09K 2003/1062; C09K 2200/0625; H01L 23/293

USPC ..................... 522/96, 902, 1, 113
See application file for complete search history.

(56) References Cited

U.S. PATENT DOCUMENTS

| | | | |
|---|---|---|---|
| 5,409,985 A | 4/1995 | Robinson et al. | |
| 5,945,463 A | 8/1999 | Kawabuchi et al. | |
| 2003/0068511 A1 | 4/2003 | Murschall et al. | |
| 2009/0023831 A1* | 1/2009 | Miyata et al. | .......... 522/97 |
| 2011/0230585 A1 | 9/2011 | Chen | |
| 2012/0041096 A1* | 2/2012 | Kurata et al. | .......... 522/180 |
| 2012/0157564 A1* | 6/2012 | Kurata | .......... 522/182 |

FOREIGN PATENT DOCUMENTS

| | | | |
|---|---|---|---|
| JP | 48-013940 | | 5/1973 |
| JP | 06-220324 | | 8/1994 |
| JP | 2003-041030 | | 2/2003 |
| JP | 2003-277505 | | 10/2003 |
| JP | 2004-026919 | | 1/2004 |
| JP | 2004-183177 | | 7/2004 |
| JP | 2006-321933 | | 11/2006 |
| JP | 2007-070417 | | 3/2007 |
| JP | 2008-255214 | | 10/2008 |
| JP | 2009-209233 | | 9/2009 |
| JP | 2010-260918 | * | 11/2010 |
| WO | 96/10594 | | 4/1996 |
| WO | 2007/086461 | | 8/2007 |
| WO | 2010/126040 | * | 4/2010 |
| WO | 2010/071171 | | 6/2010 |
| WO | 2010/126040 | | 11/2010 |
| WO | 2011/024810 | * | 2/2011 |

OTHER PUBLICATIONS

Kurata et al, JP 2010-260918 machine translation, Nov. 2010.*
International Search Report for PCT/JP2012/078297, dated Jan. 22, 2013.

* cited by examiner

*Primary Examiner* — Ling Choi
*Assistant Examiner* — Jessica E Whiteley
(74) *Attorney, Agent, or Firm* — Roylance, Abrams, Berdo & Goodman, L.L.P.

(57) ABSTRACT

A photocurable material for sealing including (A) an oligomer having a weight average molecular weight of 10,000 to 30,000 and having (meth)acryloyl group(s), (B) a (meth) acrylate monomer, (C) a polythiol compound, and optionally (D) a carbodiimide compound enables the provision of a sealing material that has high compression recovery performance, high tensile strength and excellent flexibility, can have low hardness if required, and therefore has excellent sealing properties including air-tightness performance and water-proof performance and undergoes the formation of little surface tacks and the like.

10 Claims, No Drawings

PHOTOCURABLE MATERIAL FOR SEALING, SEALING METHOD, SEALING MATERIAL, AND HOUSING USING SAID SEALING MATERIAL

CROSS REFERENCE TO RELATED APPLICATIONS

The present application is a Continuation-In-Part of International Application No. PCT/JP2012/078297 filed Nov. 1, 2012, which claims priority to Japanese Patent Application No. 2011-260330 filed Nov. 29, 2011, the entire contents of each of these applications being incorporated herein by reference in their entirety.

TECHNICAL FIELD

The present invention relates to a photocurable material for sealing, a sealing method, a sealing material and a housing the sealing material. More specifically, the present invention relates to a photocurable material for sealing, which can be deeply cured easily and instantly with ultraviolet ray or the like.

BACKGROUND ART

In recent years, customer demand has increased on products having high sealing properties including water-proof performance and air-tightness performance in housings for electronic products such as mobile phones, digital cameras and video cameras, home electric appliances such as refrigerators, air conditioners and washing machines, and precision apparatuses such as cameras and watches. In mobile phones, for example, although hard resins such as nylon/GF have been used conventionally, in recent years, more inexpensive general-purpose resins such as ABS or ABS/PC are used. However, ABS, ABS/PC and the like are flexible and are likely to be deformed, and therefore conventional sealing materials have such a problem that satisfactory sealing properties cannot be achieved. Thus, sealing materials having higher flexibility and tensile strength than those of conventional sealing materials have been demanded.

As the conventional sealing materials, a hot-melt adhesive agent, a one-liquid type urethane-based reactive hot-melt adhesive agent, a thermoplastic hot-melt sealing material, a moisture-curable hot-melt sealing material, a heat-curable sealing material, a molding rubber sealing material (gasket), a two-liquid type urethane-based foamable sealing material and the like are known. However, all of these materials have problems of insufficient heat resistance, water-proof performance and the like, poor workability due to the requirement of preventing the inclusion of moisture or the like, thermal damage to devices and housings resulting from heating, poor workability due to the requirement of using a mold upon production and the like. Therefore, particularly when a flexible general-purpose resin is used for housings for electronic products, home electric appliances, precision apparatuses and so on, a satisfactory level of performance cannot be achieved.

A photocurable sealing material enables the production of a sealing material on a housing without using any mold, and therefore has excellent workability compared with those of conventional sealing materials. As the photocurable sealing material, there are two major materials, i.e., a photocurable sealing material for which radical polymerization of an acryloyl group is employed and an ene-thiol-type photocurable sealing material for which an ene-thiol reaction is employed. The photocurable sealing material for which radical polymerization of an acryloyl group is employed is disclosed in, for example, Patent Documents 1 and 2, which is produced by curing a composition including a urethane acrylate oligomer, an acrylate monomer, and a photopolymerization initiator (and a photo-sensitizer) with light or the like. However, the photocurable sealing materials disclosed in Patent Documents 1 and 2 do not have satisfactory levels of flexibility and tensile strength required for housings for electronic products, home electric appliances, precision apparatuses and so on.

The ene-thiol-type photocurable sealing material is disclosed in, for example, Patent Documents 3 to 6. In Patent Document 3, a photocurable resin composition containing a polyene, a polythiol, and a compound having a bromine-substituted aromatic ring is disclosed, and it is described that a cured product of the composition has a high refractive index, excellent adhesion strength and surface curability and the refractive index of the cured product can be controlled with high accuracy. In Patent Document 4, an ene-thiol-type photocurable resin composition containing a polyene compound and a (poly)thiol monomer including a polymercaptocarboxylic acid amide compound is disclosed, and it is described that the polymerization of the composition is not inhibited by oxygen, the composition can be cured within a short time and has a small volumetric contraction, the amount of a photo-initiator to be used in the composition can be reduced, and the moisture resistance of the composition can be improved greatly. In Patent Document 5, a curable composition containing a thiol compound having two or more groups of a specific structure and a urethane compound containing an ethylenically unsaturated double bond of a specific structure is disclosed, and it is described that a cured product of the composition has high adhesion to a base, high reactivity, high transparency, high heat resistance and high hardness. In Patent Document 6, a photocurable resin composition that contains polybutadiene (meth)acrylate, a polythiol compound and a photo-radical initiator and can be cured upon the irradiation by means of an ultraviolet ray LED is disclosed, and it is described that the composition can be cured rapidly and has excellent surface curability, excellent moisture resistance and excellent air-tightness performance. However, any of Patent Documents 3 to 6 do not mention in any way about flexibility, tensile strength and so on required for housings for electronic products, house electric appliances, precision apparatuses and the like.

A photocurable sealing material that can be cured by carrying out both the radical polymerization reaction of an acryloyl group and the ene-thiol reaction simultaneously and competitively is disclosed in Patent Documents 7 and 8. In Patent Documents 7 and 8, a material for gaskets is disclosed which includes (A) an oligomer having (meth)acryloyl group(s), (B) a (meth)acrylate monomer and (C) a polythiol compound, wherein the functional group ratio of the number of acryloyl groups to the number of mercapto groups is 100: 0.1 to 100:5n, wherein n is the number of mercapto groups per molecule of the polythiol compound. In these Patent Documents, it is described that the material for gaskets can be improved in breaking elongation and can suppress the occurrence of cracking, breaking or the like. All polythiol compounds that are used specifically in Examples in Patent Document 7 are compounds each having a primary thiol group. However, all of cured products of the materials for gaskets obtained in Examples are insufficient with respect to any one of flexibility, breaking elongation (tensile strength) and compression recovery rate and there can be found no material that has all of the functions usable in housings for electronic products, house electric appliances, precision apparatuses or the like in Examples. Further, when it was tried to follow the examination of the sealing materials shown in Table 2 in Patent Document 7, it was found that the energy-ray-curable oligomer A ("Litetac PUA-KH32M"; produced by Kyoeisha Chemical Co., Ltd.) was no longer in production. Then, the oligomers and the monomers contained in the sealing materials were mixed properly and the examination was followed. As a result, as shown in Comparative Examples in the present description, only extremely hard sealing materials each having a hardness value of 50 or more were produced, and these sealing materials are not suitable as sealing materials for use in housings.

CITATION LIST

Patent Document

PTD 1: WO 96/10594
PTD 2: Japanese Patent Laying-Open No. 2004-26919
PTD 3: Japanese Patent Laying-Open No. 2003-277505
PTD 4: Japanese Patent Laying-Open No. 2007-70417
PTD 5: WO 2007/086461
PTD 6: WO 2010/071171
PTD 7: Japanese Patent Laying-Open No. 2010-260918
PTD 8: WO 2010/126040

SUMMARY OF INVENTION

Technical Problem

A problem to be solved by the present invention is to provide a sealing material that has a high compression recovery rate, high tensile strength and an excellent percentage of elongation, can have low hardness if required, and therefore has excellent sealing properties including air-tightness performance and water-proof performance and has little surface tacks. Another problem to be solved by the present invention is to provide a photocurable material for sealing that can be deeply cured easily and instantly to produce the above-mentioned sealing material and has good storage stability until being used.

Solution to Problem

The present inventors have made intensive studies for the purpose of solving the problems. As a result, it is found that, when a photocurable material for sealing including (A) an oligomer having a weight average molecular weight of 10,000 to 30,000 and having (meth)acryloyl group(s), (B) a (meth)acrylate monomer and (C) a polythiol compound at a specified ratio is photocured, the resultant cured product surprisingly has far higher tensile strength (breaking elongation) compared with those of the materials disclosed in the above-mentioned Patent Documents and also has a high compression recovery rate. This finding leads to the accomplishment of the present invention. That is, the present invention is as follows.

[1] A photocurable material for sealing, including (A) an oligomer having a weight average molecular weight of 10,000 to 30,000 and having (meth)acryloyl group(s), (B) a (meth)acrylate monomer, and (C) a polythiol compound,
wherein the (meth)acrylate (B) is contained in an amount of 5 to 100 parts by weight relative to 100 parts by weight of (A) the oligomer having (meth)acryloyl group(s), and
the ratio of the number of (meth)acryloyl groups contained in both of (A) the oligomer having (meth)acryloyl group(s) and (B) the (meth)acrylate monomer to the number of mercapto groups contained in (C) the polythiol compound present in the photocurable material for sealing is 100:5n to 100:25n, wherein n is the number of mercapto groups per molecule of the polythiol compound.

[2] The photocurable material for sealing according to [1], wherein (D) a carbodiimide compound is contained in an amount of 0.1 to 15 parts by weight relative to 100 parts by weight of (A) the oligomer having (meth)acryloyl group(s).

[3] The photocurable material for sealing according to [1] or [2], wherein (C) the polythiol compound has 2 to 6 mercapto groups per molecule and each of the mercapto groups is a secondary mercapto group.

[4] The photocurable material for sealing according to [1] or [2], wherein (C) the polythiol compound is an ester produced from a polyhydric alcohol having 2 to 6 hydroxy groups and β-mercaptobutanoic acid.

[5] The photocurable material for sealing according to any of [1] to [4], wherein (B) the (meth)acrylate monomer is a monofunctional (meth)acrylate, a polyfunctional (meth)acrylate or a combination thereof.

[6] The photocurable material for sealing according to any of [1] to [5], wherein (A) the oligomer having (meth)acryloyl group(s) is at least one selected from the group consisting of a urethane-type (meth)acrylate oligomer, a polyester-type (meth)acrylate oligomer, a polyether-type (meth)acrylate oligomer, an epoxy-type (meth)acrylate oligomer, a conjugated-diene-polymer-type (meth)acrylate oligomer and hydrogenated products thereof.

[7] The photocurable material for sealing according to any of [1] to [6], wherein (E) a photo-radical polymerization initiator and/or (F) a viscosity control agent is additionally contained.

[8] A sealing method including photocuring the photocurable material for sealing according to any of [1] to [7].

[9] A sealing material produced by photocuring the photocurable material for sealing according to any of [1] to [7].

[10] A housing a sealing material produced by photocuring the photocurable material for sealing according to any of [1] to [7].

[11] A stabilizing agent for an ene-thiol-type photocurable resin material, containing a carbodiimide compound.

Advantageous Effects of Invention

According to the photocurable material for sealing according to the present invention, it becomes possible to provide a sealing material that has a high compression recovery rate, high tensile strength and excellent flexibility, and therefore has excellent sealing properties including air-tightness performance and water-proof performance and undergoes the formation of little surface tacks. The photocurable material for sealing according to the present invention can be deeply cured easily and instantly to produce the above-mentioned sealing material and can have storage stability until being used.

DESCRIPTION OF EMBODIMENTS

The photocurable material for sealing according to the present invention is described sequentially.

(A) Oligomer Having a Weight Average Molecular Weight of 10,000 to 30,000 and Having (Meth)Acryloyl Group(s)

The oligomer (A) has a weight average molecular weight of 10,000 to 30,000, and is preferably an oligomer having a weight average molecular weight of 12,000 to 25,000, more preferably an oligomer having a weight average molecular weight of 15,000 to 22,000. The oligomer (A) is preferably an oligomer having at least two (meth)acrylate groups in the molecule, and the number of (meth)acrylate groups per molecule of the oligomer (A) is, for example, 2 to 10, preferably 2 to 6, more preferably 2 to 4, particularly preferably 2.

Examples of the oligomer (A) include: a conjugated-diene-polymer-type (meth)acrylate oligomer such as a urethane-type (meth)acrylate oligomer, a polyester-type (meth)acrylate oligomer, a polyether-type (meth)acrylate oligomer, an acrylic (meth)acrylate oligomer, an epoxy-type (meth)acrylate oligomer and a polybutadiene oligomer; and hydrogenated products thereof and silicone (meth)acrylate.

The urethane-type (meth)acrylate oligomer is, for example, an oligomer obtained by reacting a polyol such as a polyether polyol, a polyester polyol and a carbonate diol with a polyisocyanate to obtain a polyurethane oligomer and then esterifying the oligomer with (meth)acrylic acid.

The polyester-type (meth)acrylate oligomer is, for example, an oligomer obtained by condensing a polycarboxylic acid and a polyhydric alcohol or adding an alkylene oxide to a polycarboxylic acid to obtain a polyester oligomer having a hydroxy group at each terminal and esterifying the hydroxy group with (meth)acrylic acid.

The polyether-type (meth)acrylate oligomer is, for example, an oligomer obtained by esterifying a hydroxy group in a polyether polyol with (meth)acrylic acid.

The acrylic (meth)acrylate oligomer is, for example, a telechelic polyacrylate having a highly controlled structure by applying an atom transfer radical polymerization (ATRP) method.

The epoxy-type (meth)acrylate oligomer is, for example, an oligomer obtained by reacting a (meth)acrylic acid to an oxirane ring in a bisphenol-type epoxy resin or a novolac-type epoxy resin each having a relatively low molecular weight to esterify the oxirane ring, and a carboxyl-modified epoxy acrylate oligomer obtained by partially modifying the epoxy-type (meth)acrylate oligomer with a dicarboxylic acid anhydride is also included.

Examples of the conjugated-diene-polymer-type (meth)acrylate oligomer include an SBR diacrylate obtained by esterifying a liquid styrene-butadiene copolymer with acrylic acid, a polyisoprene diacrylate obtained by esterifying polyisoprene with acrylic acid, a polybutadiene acrylate obtained by esterifying polybutadiene with acrylic acid, and a polybutadiene acrylate obtained by reacting a (meth)acrylate having an isocyanate group with 1,2-polybutadiene having hydroxy groups at the terminals.

Examples of the silicone (meth)acrylate include an ester compound obtained by esterifying a hydroxyl group in an alcoholic siloxane compound with acrylic acid, and so on.

The oligomer (A) may be used singly, or two or more of the above-mentioned oligomers (A) may be used in combination. A preferred example of the oligomer (A) is a urethane-type (meth)acrylate oligomer such as a urethane-type polyester (meth)acrylate oligomer.

With respect to a urethane-type (meth)acrylate oligomer having two (meth)acryloyl groups, which is a preferred example of the oligomer (A), examples of the polyether diol, the polyester diol and the carbonate diol each having two hydroxy groups which are used for the production of the urethane-type (meth)acrylate oligomer include the following compounds.

Examples of the polyether diol include polyethylene glycol, polypropylene glycol, polytetramethylene glycol, polyhexamethylene glycol, and a polyether diol obtained by adding ethylene oxide, propylene oxide or the like to 1,3-butylene glycol, 1,4-butylene glycol, neopentyl glycol, cyclohexanedimethanol, 2,2-bis(4-hydroxycyclohexyl)propane, bisphenol-A or the like.

Examples of the polyester diol include: a compound obtained by adding ethylene oxide, propylene oxide or the like to polyethylene glycol, polypropylene glycol, polytetramethylene glycol, 1,3-butylene glycol, 1,4-butylene glycol, 1,6-hexanediol, neopentyl glycol, 1,4-cyclohexanedimethanol, 2,2-bis(4-hydroxycyclohexyl)propane, bisphenol-A or the like; and a polyester diol obtained by reacting an alcohol having an ε-caprolactone added thereto with a dicarboxylic acid such as adipic acid, sebacic acid, azelaic acid and dodecanedicarboxylic acid or an anhydride of the dicarboxylic acid.

Examples of the carbonate diol include a carbonate diol obtained by reacting a diaryl carbonate or a dialkyl carbonate such as diphenyl carbonate, bis-chlorophenyl carbonate, dinaphthyl carbonate, phenyl-toluoyl-carbonate, phenyl-chlorophenyl-carbonate, 2-tolyl-4-tolyl-carbonate, dimethyl carbonate and diethyl carbonate with a diol such as 1,6-hexanediol, neopentyl glycol, 1,4-butanediol, 1,8-octanediol, 1,4-cyclohexanedimethanol, 2-methylpropanediol, dipropylene glycol and dibutylene glycol.

(B) (Meth)Acrylate Monomer

The (meth)acrylate monomer is a (meth)acrylate monomer having at least one (meth)acryloyl group in the molecule, and specific examples include a monofunctional monomer having one (meth)acryloyl group, a bifunctional monomer having two (meth)acryloyl groups, a trifunctional monomer having three (meth)acryloyl groups and a tetrafunctional monomer having four (meth)acryloyl groups.

Examples of the monofunctional monomer include methyl methacrylate, butyl methacrylate, 2-phenoxyethyl acrylate, ethoxylated 2-phenoxyethyl acrylate, 2-(2-ethoxyethoxy) ethyl acrylate, cyclic trimethylolpropane, formal acrylate, β-carboxyethyl acrylate, lauryl methacrylate, isooctyl acrylate, stearyl methacrylate, isodecyl acrylate, isobornyl methacrylate, benzyl acrylate, hydroxypivalyl hydroxypivalate diacrylate, ethoxylated 1,6-hexanediol diacrylate, dipropylene glycol diacrylate, tricyclodecane dimethanol diacrylate, ethoxylated dipropylene glycol diacrylate, neopentyl glycol diacrylate, propoxylated neopentyl glycol diacrylate, ethoxylated bisphenol-A dimethacrylate, 2-methyl-1,3-propanediol diacrylate, ethoxylated 2-methyl-1,3-propanediol diacrylate, 2-butyl-2-ethyl-1,3-propanediol diacrylate, ethylene glycol dimethacrylate, diethylene glycol dimethacrylate, 2-hydroxyethyl methacrylate phosphate, tris(2-hydroxyethyl)isocyanurate triacrylate, pentaerythritol triacrylate, ethoxylated trimethylolpropane triacrylate, propoxylated trimethylolpropane triacrylate, trimethylolpropane trimethacrylate, pentaerythritol tetraacrylate, ethoxylated pentaerythritol tetraacrylate, di-trimethylolpropane tetraacrylate, propoxylated pentaerythritol tetraacrylate, pentaerythritol tetraacrylate, dipentaerythritol hexaacrylate, methacrylate, hydroxyethyl acrylate (HEA), 2-hydroxyethyl methacrylate (HEMA), tripropylene glycol dimethacrylate, 1,4-butanediol dimethacrylate, 1,6-hexanediol dimethacrylate, arylated cyclohexyl dimethacrylate, isocyanurate dimethacrylate, ethoxylated trimethylolpropane trimethacrylate, propoxylated glycerol trimethacrylate, trimethylolpropane trimethacrylate, tris(acryloxyethyl)isocyanurate, and a combination of two or more of these compounds.

Examples of the bifunctional monomer include 1,6-hexanediol diacrylate, bisphenol-A ethoxylated acrylate, polyethylene glycol diacrylate (200-600), tripropylene glycol diacrylate, neopentyl glycol propoxylate (2), ethoxylated (2) neopentyl glycol diacrylate, dipropylene glycol diacrylate, trimethylolpropane ethoxylated (3) methyl ether diacrylate, and a combination of two or more of these compounds.

Examples of the trifunctional monomer include trimethylolpropane triacrylate, trimethylolpropane propoxylated (5-20) triacrylate, propoxylated (4) glycerol triacrylate, ethoxylated (3) trimethylolpropane triacrylate, propoxylated pentaerythritol triacrylate, and a combination of two or more of these compounds.

Examples of the tetrafunctional monomer include ditrimethylolpropane tetraacrylate, dipentaerythritol mono-hydroxypentaacrylate, and a combination of two or more of these compounds.

The (meth)acrylate monomer may be used singly, or two or more of the above-mentioned (meth)acrylate monomers may be used in combination. A preferred example of the (meth)acrylate monomer is a monofunctional monomer, and a combination of a monofunctional monomer and a bifunctional monomer is also preferred. A more preferred example is a monofunctional monomer.

The amount of the (meth)acrylate to be used is 5 to 100 parts by weight relative to 100 parts by weight of (A) the oligomer having (meth)acryloyl group(s). When the (meth)acrylate is used in an amount falling within this range, the reduction in the viscosity and the improvements in flexibility, compression recovery rate and tensile strength of the sealing material according to the present invention can be achieved. The amount of the (meth)acrylate to be used is preferably 10 to 80 parts by weight, more preferably 40 to 70 parts by weight. The type and the amount of the (meth)acrylate monomer may be controlled properly for achieving the desired properties including viscosity, flexibility, compression recovery rate and tensile strength depending on the intended use of the sealing material according to the present invention.

(C) Polythiol Compound

The polythiol compound has, for example, 2 to 10 mercapto groups in the molecule, preferably 2 to 6 mercapto groups in the molecule, more preferably 3 to 4 mercapto groups in the molecule.

Examples of the polythiol compound include the compounds mentioned in Patent Documents 3 to 8. Hereinbelow, these polythiol compounds are described specifically.

Examples of the polythiol compound include:

(a) a polythiol compound including a hydrocarbon structure (e.g., an aliphatic polythiol such as a $C_{2-20}$ alkane polythiol, an aromatic aliphatic polythiol such as xylylene dithiol, a polythiol obtained by substituting a halogen atom in a halohydrin adduct of an alcohol with a mercapto group, and a polythiol compound including a reaction product of a polyepoxide compound with hydrogen sulfide);

(b) a polythiol compound including an ether structure represented by formula (1):

[Chemical formula 1]

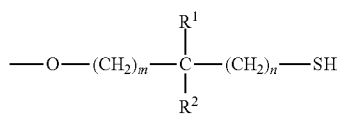

(1)

wherein $R^1$ and $R^2$ are independently hydrogen atom or a $C_{1-10}$ alkyl group; m is 0, 1 or 2; and n is 0 or 1; and (c) a polythiol compound including an ester structure represented by formula (2):

[Chemical formula 2]

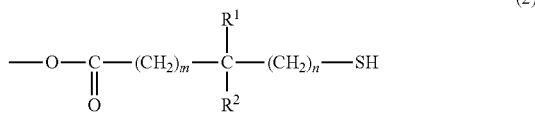

(2)

wherein $R^1$, $R^2$, m and n are as defined above. Among these polythiol compounds, (b) a polythiol compound including an ether structure and (c) a polythiol compound including an ester structure are preferred, and (c) a polythiol compound including an ester structure is more preferred.

Examples of (a) the polythiol compound including a hydrocarbon structure include 2,5-hexanedithiol, 2,9-decanedithiol and 1,4-bis(1-mercaptoethyl)benzene.

Examples of (b) the polythiol compound including an ether structure include compounds each having a structure such as a 2-mercaptoethyl ether group, a 2-mercaptopropyl ether group, a 3-mercaptopropyl ether group, a 2-mercaptobutyl ether group, a 3-mercaptobutyl ether group, a 4-mercaptobutyl ether group, a 5-mercaptopentyl ether group and a 5-mercaptohexyl ether group.

Examples of (c) the polythiol compound including an ester structure include a compound produced by esterifying a carboxylic acid containing a mercapto group, which is a compound in which hydrogen atom is bound to the left terminal of the structure of formula (2), with a polyhydric alcohol.

Specific examples of the carboxylic acid containing a mercapto group, which is a compound in which hydrogen atom is bound to the left terminal of the structure of formula (2), include thioglycolic acid, 2-mercaptopropionic acid, 3-mercaptobutyric acid, 2-mercaptoisobutyric acid, 3-mercaptoisobutyric acid, 3-mercaptopropionic acid, 3-mercapto-3-phenylpropionic acid and 3-mercapto-3-methylbutyric acid. Among these compounds, 3-mercaptobutyric acid, 3-mercapto-3-phenylpropionic acid, 3-mercapto-3-methylbutyric acid and the like are preferred, and 3-mercaptobutyric acid and the like are more preferred.

Specific examples of the polyhydric alcohol include a $C_{2-20}$ alkylene glycol (one having a $C_{2-10}$ alkylene group is preferred, in which the carbon chain may be branched; e.g., ethylene glycol, trimethylene glycol, 1,2-propylene glycol, 1,2-butanediol, 1,3-butanediol, 2,3-butanediol, tetramethylene glycol, 1,5-pentanediol, 1,6-hexanediol, 1,8-octanediol, 1,9-nonanediol, 1,12-dodecanediol, cyclohexane-1,4-dimethanol and hydrogenated bisphenol-A), diethylene glycol, a poly(oxyalkylene)glycol, glycerin, triethylene glycol, polyethylene glycol, dipropylene glycol, tripropylene glycol, polypropylene glycol, polytetramethylene ether glycol, trimethylolpropane, ditrimethylolpropane, pentaerythritol, dipentaerythritol, cyclohexanediol, cyclohexanedimethanol, norbornene dimethanol, norbornane dimethanol, polycarbonate diol, a polysilicone modified with a hydroxy group at each end, a polyol containing an aromatic ring, tris-2-hydroxyethyl isocyanurate, 2,2-bis[4-(2-hydroxyethyloxy)phenyl]propane, hydrogenated bisphenol-A, 4,4'-(9-fluorenylidene)bis(2-phenoxyethanol), a cyclohexane-1,4-dimethanol ethylene oxide adduct, a hydrogenated bisphenol-A ethylene oxide adduct, a cyclohexane-1,4-dimethanolpropylene oxide adduct, and a hydrogenated bisphenol-A propylene oxide adduct.

Preferred examples of the polyhydric alcohol include: an alkylene glycol having a $C_2$ alkylene main chain, e.g., ethylene glycol, 1,2-propylene glycol and 1,2-butanediol; trimethylolpropane, polycarbonate diol, cyclohexane diol, cyclohexanedimethanol and 1,5-pentanediol. Examples of the polyol containing an aromatic ring include 2,2-bis[4-(2-hydroxyethyloxy)phenyl]propane, 4,4'-(9-fluorenylidene)diphenol and 4,4'-(9-fluorenylidene)bis(2-phenoxyethanol).

Examples of the polythiol compound include a polythiol compound represented by formula (3) or formula (4):

[Chemical formula 3]

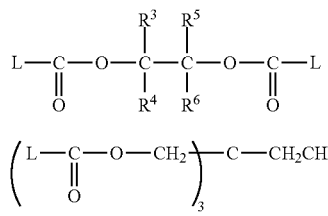

wherein $R^3$ to $R^6$ are independently a hydrogen atom or a $C_{1-10}$ alkyl group; L-C(O)—O— is a structure of formula (2). As the $C_{1-10}$ alkyl group that corresponds to each of $R^3$ to $R^6$ in formula (3), a linear or branched $C_{1-3}$ alkyl group is preferred, and specific examples include methyl group, ethyl group, n-propyl group and isopropyl group. Among these groups, methyl group and ethyl group are preferred. A polythiol compound in which $R^3$ is hydrogen atom, methyl group or ethyl group and all of $R^4$ to $R^6$ are hydrogen atoms is particularly preferred.

Specific examples of the polythiol compound of this type include phthalic acid di(1-mercaptoethyl ester), phthalic acid di(2-mercaptopropyl ester), phthalic acid di(3-mercaptobutyl ester), phthalic acid di(3-mercaptoisobutyl ester), ethylene glycol bis(3-mercaptobutyrate), propylene glycol bis(3-mercaptobutyrate), diethylene glycol bis(3-mercaptobutyrate), butanediol bis(3-mercaptobutyrate), octanediol bis(3-mercaptobutyrate), trimethylolpropane tris(3-mercaptobutyrate), pentaerythritol tetrakis(3-mercaptobutyrate), dipentaerythritol hexakis(3-mercaptobutyrate), 1,3-butanediol bis(3-mercaptobutyrate), 1,4-butanediol bis(3-mercaptobutyrate), neopentyl glycol bis(3-mercaptobutyrate), 1,6-hexanediol bis(3-mercaptobutyrate), 1,8-octanediol bis(3-mercaptobutyrate), 1,9-nonanediol bis(3-mercaptobutyrate), cyclohexane-1,4-dimethanol bis(3-mercaptobutyrate), diethylene glycol bis(3-mercaptobutyrate), triethylene glycol bis(3-mercaptobutyrate), polyethylene glycol bis(3-mercaptobutyrate), dipropylene glycol bis(3-mercaptobutyrate), tripropylene glycol bis(3-mercaptobutyrate), polypropylene glycol bis(3-mercaptobutyrate), polytetramethylene ether glycol bis(3-mercaptobutyrate), bis(3-mercaptobutyrate) of a cyclohexane-1,4-dimethanol ethylene oxide adduct, bis(3-mercaptobutyrate) of a hydrogenated bisphenol-A ethylene oxide adduct, bis(3-mercaptobutyrate) of a cyclohexane-1,4-dimethanol propylene oxide adduct, bis(3-mercaptobutyrate) of a hydrogenated bisphenol-A propylene oxide adduct, glycerol tris(3-mercaptobutyrate), diglycerol tetrakis(3-mercaptobutyrate), trimethylolpropane tris(3-mercaptobutyrate), ditrimethylolpropane tetrakis(3-mercaptobutyrate), pentaerythritol tetrakis(3-mercaptobutyrate), dipentaerythritol hexakis(3-mercaptobutyrate), ethylene glycol bis(2-mercaptopropionate), propylene glycol bis(2-mercaptopropionate), diethylene glycol bis(2-mercaptopropionate), butanediol bis(2-mercaptopropionate), octanediol bis(2-mercaptopropionate), trimethylolpropane tris(2-mercaptopropionate), pentaerythritol tetrakis(2-mercaptopropionate), dipentaerythritol hexakis(2-mercaptopropionate), ethylene glycol bis(3-mercaptoisobutyrate), propylene glycol bis(3-mercaptoisobutyrate), diethylene glycol bis(3-mercaptoisobutyrate), butanediol bis(3-mercaptoisobutyrate), octanediol bis(3-mercaptoisobutyrate), trimethylolpropane tris(3-mercaptoisobutyrate), pentaerythritol tetrakis(3-mercaptoisobutyrate), dipentaerythritol hexakis(3-mercaptoisobutyrate), ethylene glycol bis(2-mercaptoisobutyrate), propylene glycol bis(2-mercaptoisobutyrate), diethylene glycol bis(2-mercaptoisobutyrate), butanediol bis(2-mercaptoisobutyrate), octanediol bis(2-mercaptoisobutyrate), trimethylolpropane tris(2-mercaptoisobutyrate), pentaerythritol tetrakis(2-mercaptoisobutyrate), dipentaerythritol hexakis(2-mercaptoisobutyrate), ethylene glycol bis(4-mercaptovalerate), propylene glycol bis(4-mercaptoisovalerate), diethylene glycol bis(4-mercaptovalerate), butanediol bis(4-mercaptovalerate), octanediol bis(4-mercaptovalerate), trimethylolpropane tris(4-mercaptovalerate), pentaerythritol tetrakis(4-mercaptovalerate), dipentaerythritol hexakis(4-mercaptovalerate), ethylene glycol bis(3-mercaptovalerate), propylene glycol bis(3-mercaptovalerate), diethylene glycol bis(3-mercaptovalerate), butanediol bis(3-mercaptovalerate), octanediol bis(3-mercaptovalerate), trimethylolpropane tris(3-mercaptovalerate), pentaerythritol tetrakis(3-mercaptovalerate), dipentaerythritol hexakis(3-mercaptovalerate), hydrogenated bisphenol-A bis(3-mercaptobutyrate), bisphenol-A dihydroxyethyl ether-3-mercaptobutyrate, 4,4'-(9-fluorenylidene)bis(2-phenoxyethyl (3-mercaptobutyrate)), ethylene glycol bis(3-mercapto-3-phenylpropionate), propylene glycol bis(3-mercapto-3-phenylpropionate), diethylene glycol bis(3-mercapto-3-phenylpropionate), butanediolbis(3-mercapto-3-phenylpropionate), octanediol bis(3-mercapto-3-phenylpropionate), trimethylolpropane tris(3-mercapto-3-phenylpropionate), tris-2-(3-mercapto-3-phenylpropionate)ethyl isocyanurate, pentaerythritol tetrakis(3-mercapto-3-phenylpropionate), dipentaerythritol hexakis(3-mercapto-3-phenylpropionate), ethylene glycol bis(thioglycolate), trimethylene glycol bis(thioglycolate), propylene glycol bis(thioglycolate), 1,3-butanediol bis(thioglycolate), 1,4-butanediol bis(thioglycolate), neopentyl glycol bis(thioglycolate), 1,6-hexanediol bis(thioglycolate), 1,8-octanediol bis(thioglycolate), 1,9-nonanediol bis(thioglycolate), cyclohexane-1,4-dimethanol bis(thioglycolate), diethylene glycol bis(thioglycolate), triethylene glycol bis(thioglycolate), polyethylene glycol bis(thioglycolate), dipropylene glycol bis(thioglycolate), tripropylene glycol bis(thioglycolate), polypropylene glycol bis(thioglycolate), polytetramethylene ether glycol bis(thioglycolate), a bis(thioglycolate) of a cyclohexane-1,4-dimethanol ethylene oxide adduct, a bis(thioglycolate) of a hydrogenated bisphenol-A ethylene oxide adduct, a bis(thioglycolate) of a cyclohexane-1,4-dimethanol propylene oxide adduct, a bis(thioglycolate) of a hydrogenated bisphenol-A propylene oxide adduct, glycerol tris(thioglycolate), diglycerol tetrakis(thioglycolate), trimethylolpropane tris(thioglycolate), ditrimethylolpropane tetrakis(thioglycolate), pentaerythritol tetrakis(thioglycolate), dipentaerythritol hexakis(thioglycolate), ethylene glycol bis(3-mercaptopropionate), trimethylene glycol bis(3-mercaptopropionate), propylene glycol bis(3-mercaptopropionate), 1,3-butanediol bis(3-mercaptopropionate), 1,4-butanediol bis(3-mercaptopropionate), neopentyl glycol bis(3-mercaptopropionate), 1,6-hexanediol bis(3-mercaptopropionate), 1,8-octanediol bis(3-mercaptopropionate), 1,9-nonanediol bis(3-mercaptopropionate), cyclohexane-1,4-dimethanol bis(3-mercaptopropionate), diethylene glycol bis(3-mercaptopropionate), triethylene glycol bis(3-mercaptopropionate), polyethylene glycol bis(3- mercaptopropionate), dipropylene glycol bis(3-mercaptopropionate), tripropylene glycol bis(3-mercaptopropionate), polypropylene glycol bis(3-mercaptopropionate), polytetramethylene ether glycol bis(3-mercaptopropionate), a bis(3-mercaptopropionate) of a cyclohexane-1,4-dimethanol ethylene oxide adduct, a bis(3-mercaptopropionate) of a hydrogenated bisphenol-A ethylene oxide adduct, a bis(3-mercaptopropionate) of a cyclohexane-1,4-dimethanol propylene oxide adduct, a bis(3-mercaptopropionate) of a hydrogenated bisphenol-A propylene oxide adduct, glycerol tris(3-mercaptopropionate), diglycerol tetrakis(3-mercaptopropionate), trimethylolpropane tris(3-mercaptopropionate), ditrimethylolpropane tetrakis(3-mercaptopropionate), pentaerythritol tetrakis(3-mercaptopropionate) and dipentaerythritol hexakis(3-mercaptopropionate).

Among these polythiol compounds, poly(3-mercaptobutyrates) are preferred, and polyethylene glycol bis(3-mercaptobutyrate), pentaerythritol tetrakis(3-mercaptobutyrate), dipentaerythritol hexakis(3-mercaptobutyrate) and the like are particularly preferred. Specific examples of the structure of the more preferred polythiol compound are as follows.

[Chemical formula 4]

(5)

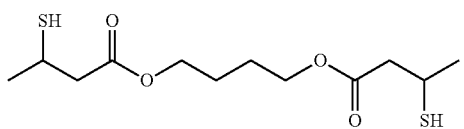

(6)

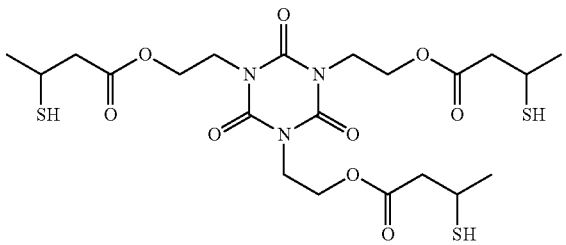

(7)

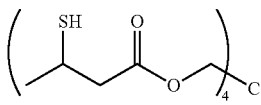

[Chemical formula 5]

(8)

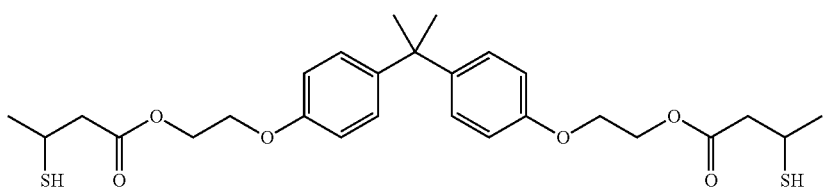

(9)

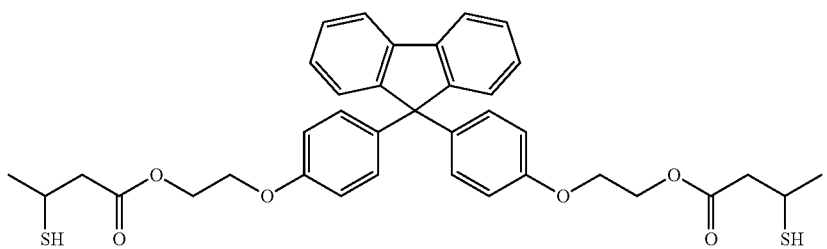

(10)

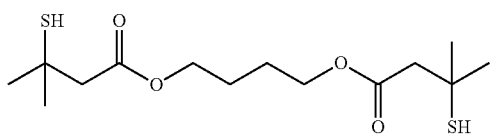

(11)

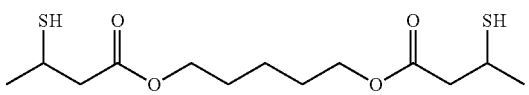

[Chemical formula 6]

(12)

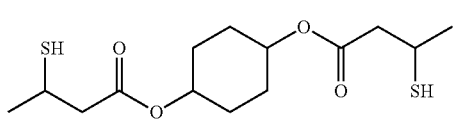

(13)

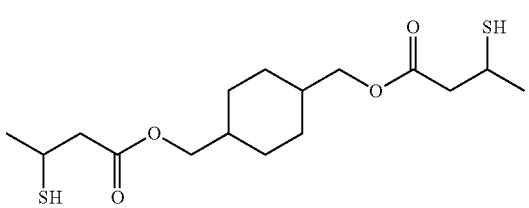

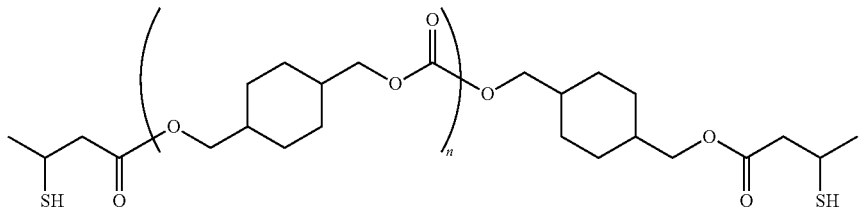

wherein n is an integer of 1 to 10.

A preferred example of the polythiol compound is a compound having a secondary mercapto group. A secondary thiol compound has superior storage stability to that of a primary thiol compound. A sealing material produced using the photocurable material for sealing according to the present invention has superior sealing properties to those of sealing materials produced using conventionally known photocurable materials for sealing. When a polythiol compound having a secondary thiol group is used, the resultant sealing material has excellent coating stability upon coating and excellent stability of sealing properties, and particularly has excellent hardness and flexibility stably. As one reason for this fact, it is assumed that the balance between the radical reaction in the ene-thiol reaction and the thermal addition reaction is adjusted in a preferred manner by the steric hindrance around the thiol group.

The amount of the polythiol compound to be used is such an amount that the ratio of the number of (meth)acryloyl groups contained in both (A) the oligomer having (meth)acryloyl group(s) and (B) the (meth)acrylate monomer to the number of mercapto groups contained in (C) the polythiol compound present in the photocurable material for sealing is 100:5n to 100:25n, wherein n is the number of mercapto groups per molecule of the polythiol compound, preferably such an amount that the ratio is 100:7n to 100:20n, more preferably such an amount that the ratio is 100:9n to 100:17n.

(D) Carbodiimide Compound

The carbodiimide compound refers to a hydrolysis-resistant stabilizing agent (hydrolysis-resistant agent) that can remove a hydroxy group or a carboxyl group generated by hydrolysis of a resin such as a polyester to suppress the cycle of the hydrolysis. Examples of the carbodiimide compound include a monocarbodiimide compound and a polycarbodiimide compound, which are widely known and can be used. The carbodiimide compounds are mentioned in, for example, Japanese Patent Laying-Open No. H9-309871, Japanese Patent Laying-Open No. H9-249801, Japanese Patent Laying-Open No. H9-208649, Japanese Patent Laying-Open No. H9-296097, Japanese Patent Laying-Open No. H8-81533, Japanese Patent Laying-Open No. H8-27092, Japanese Patent Laying-Open No. H9-136869, Japanese Patent Laying-Open No. H9-124582, Japanese Patent Laying-Open No. H9-188807, Japanese Patent Laying-Open No. 2005-82642, Japanese Patent Laying-Open No. 2005-53870, Japanese Patent Laying-Open No. 2012-36392, Japanese Patent Laying-Open No. 2010-163203, Japanese Patent Laying-Open No. 2011-174094, WO 2008/072514, Japanese Patent Laying-Open No. 2012-81759, Japanese Patent Laying-Open No. 2012-52014 and Japanese Patent Laying-Open No. 2012-7079.

For example, a compound represented by formula are included:

wherein $R^{11}$ may be the same as or different from each other and is independently a bivalent aromatic group and/or a bivalent aliphatic group;

when $R^{11}$ is an aromatic oligomeric carbodiimide or an aromatic polymeric carbodiimide, $R^{11}$ may be substituted with an aliphatic substituent and/or an alicyclic substituent and/or an aromatic substituent each having at least one carbon atom, wherein the substituent may have a hetero atom and the substitution by the substituent may occur at least one ortho-position in an aromatic group to which the carbodiimide group is bound;

$R^{12}$ is $C_{1-18}$ alkyl, $C_{5-18}$ cycloalkyl, aryl, $C_{7-18}$ aralkyl, $-R^{11}-NH-COS-R^{14}$, $-R^{11}COOR^{14}$, $-R^{11}-OR^{14}$, $-R^{11}-N(R^{14})_2$, $-R^{11}-SR^{14}$, $-R^{11}-OH$, $R^{11}-NH_2$, $-R^{11}-NHR^{14}$, $-R^{11}$-epoxy, $-R^{11}-NCO$, $-R^{11}-NH-CONHR^{14}$, $-R^{11}-NHCONR^{14}R^{15}$ or $-R^{11}-NH-COOR^{16}$;

$R^{13}$ is $-N=C=N$-aryl, $-N=C=N$-alkyl, $-N=C=N$-cycloalkyl, $-N=C=N$-aralkyl, $-NCO$, $-NHCONHR^{14}$, $-NHCONHR^{14}R^{15}$, $-NHCOOR^{16}$, $-NHCOS-R^{14}$, $-COOR^{14}$, $-OR^{14}$, epoxy, $-N(R^{14})_2$, $-SR^{14}$, $-OH$, $-NH_2$ or $-NHR^{14}$ $R^{14}$ and $R^{15}$ may be the same as or different from each other, and are independently $C_{1-20}$ alkyl, $C_{3-20}$ cycloalkyl, $C_{7-18}$ aralkyl, an oligo/polyethylene glycol, and/or an oligo/polypropylene glycol;

$R^{16}$ has one of the variables defined for $R^{14}$ or is a polyester group or a polyamide group; and m is 1 to 5 when the carbodiimide compound is an oligomeric carbodiimide and is more than 5 when the carbodiimide compound is a polymeric carbodiimide.

Preferred examples of the carbodiimide compound include an aliphatic polycarbodiimide compound having multiple-$N=C=N$— groups, and more preferred examples of the carbodiimide compound include a linear aliphatic polymer compound. Specific examples include an aliphatic polycarbodiimide compound (e.g., Elastostab H01, produced by Nisshinbo Chemical Inc.).

The amount of the carbodiimide compound to be used is, for example, 0.1 to 15 parts by weight, preferably 0.5 to 12 parts by weight, more preferably 1 to 10 parts by weight, relative to 100 parts by weight of (A) the oligomer having (meth)acryloyl group(s).

As described in Examples 9 to 11 mentioned below, when the photocurable material for sealing mentioned in [1] above was stored at 23° C., although the photocurable material was stable for 1 month, the photocurable material turned into a gel thereafter. When the carbodiimide compound was added to the photocurable material, the photocurable material was stable for 6 months or longer and had excellent storage stability, and the properties of a sealing material produced by photocuring the photocurable material were little affected. The present inventors assume that the preferential binding of the carbodiimide compound to the most active thiol group inactivates the procession of the reaction between an active thiol group and a double bond contained in the ene-thiol-type photocurable resin material during the storage of the material followed by gel formation, and thereby leads to the stabilization effect during storage by the carbodiimide compound. Incidentally, a fact that a carbodiimide compound has an effect of improving the storage stability of an ene-thiol-type photocurable resin material has not been known until now, and therefore this effect cannot be conceived easily by persons skilled in the art.

The above-mentioned carbodiimide compound can also be used as a stabilizing agent for an ene-thiol-type photocurable resin material. Examples of the ene-thiol-type photocurable material for sealing include those which are commonly known, such as the ene-thiol-type photocurable material for sealing mentioned in [1] above and the photocurable resin materials described in Patent Documents 3 to 8. The amount of the carbodiimide compound to be added to the ene-thiol-type photocurable resin material may be varied properly on the basis of the amount to be used for the ene-thiol-type photocurable material for sealing as mentioned in [1] above.

(E) Photo-Radical Polymerization Initiator

As the photo-radical polymerization initiator, for example, an intramolecular-cleavage-type and/or hydrogen-abstraction-type photo-radical polymerization initiator, preferably an intramolecular-cleavage-type photo-radical polymerization initiator, can be used. As a radical ultraviolet ray polymerization initiator, any known one may be used properly, and specific examples include: a benzoin and an alkyl ether thereof such as benzoin, benzoin methyl ether and benzoin ethyl ether; an acetophenone such as acetophenone, 2,2-dimethoxy-2-phenyl acetophenone, 1,1-dichloro acetophenone, 4-(1-t-butyldioxy-1-methylethyl)acetophenone and diethoxy acetophenone; an anthraquinone such as 2-methylanthraquinone, 2-amylanthraquinone, 2-t-butylanthraquinone and 1-chloronthraquinone; a thioxanthone such as 2,4-dimethylthioxanthone, 2,4-diisopropylthioxanthone and 2-chlorothioxanthone; a ketal such as acetophenone dimethyl ketal and benzyl dimethyl ketal; a benzophenone such as benzophenone, 4-(1-t-butyldioxy-1-methylethyl)benzophenone and 3,3',4,4'-tetrakis(t-butyldioxycarbonyl)benzophenone; an α-aminoalkylphenone such as 2-methyl-1-[4-(methylthio)phenyl]-2-morpholino-propane-1-one and 2-benzyl-2-dimethylamino-1-(4-morpholinophenyl)-1-butanone; an α-hydroxyalkylphenone such as 1-hydroxy-cyclohexyl-phenyl-ketone, 2-hydroxy-1{4-[4-(2-hydroxy-2-methyl-propionyl)-benzyl]phenyl}-2-methyl-propane-1-one and 2-hydroxy-2-methyl-1-phenyl-propane-1-one; a phenyl glyoxylate such as an alkyl phenyl glyoxylate; diethoxy acetophenone; an acyl phosphine oxide such as 2,4,6-trimethyl benzoyl phenyl ethoxy phosphine oxide; a titanocene compound such as bis(5,2,4-cyclopentadiene-1-yl)-bis(2,6-difluoro-3-(1H-pyrrole-1-yl)-phenyl)titanium; and a combination of two or more of the above-mentioned compounds.

Preferred examples of the photo-radical polymerization initiator include intramolecular-cleavage-type photo-radical initiators such as a benzoin, a ketal, an α-hydroxyalkylphenone, an α-aminoalkylphenone, an acyl phosphine oxide, a phenyl glyoxylate, an acetophenone and a titanocene compound.

The amount of the photo-radical polymerization initiator to be added is not particularly limited, and the amount is, for example, 0.1 to 10 parts by weight, preferably 0.2 to 5 parts by weight, more preferably 0.5 to 2 parts by weight, relative to 100 parts by weight of the total components (A) to (C).

(F) Viscosity Control Agent

The viscosity control agent is not particularly limited, and examples include white carbon, colloidal silica, silica sand (silica powder), aerosil, diatomaceous earth, hydrophobic calcium carbonate, glass balloon, glass beads and polyvinyl pyrrolidone. These viscosity control agents may be used singly, or two or more of these viscosity control agents may be used in combination. Preferred examples of the viscosity control agent include an inorganic viscosity control agent such as aerosol.

The amount of the viscosity control agent to be added is not particularly limited. The amount is, for example, 0.1 to 20 parts by weight, preferably 0.2 to 10 parts by weight, relative to 100 parts by weight of the total components (A) to (C).

(G) Sensitizer

For the purpose of achieving the photocuring with an ultraviolet ray as well as visible light and near-infrared ray, a sensitizer can also be added. Examples of the sensitizer include: a chalcone derivative, an unsaturated ketone (e.g., dibenzalacetone), a 1,2-diketone derivative (e.g., camphorquinone), a benzoin derivative, a fluorene derivative, a naphthoquinone derivative, an anthraquinone derivative, a xanthene derivative, a thioxanthene derivative, a xanthone derivative, a thioxanthone derivative, a coumarin derivative, a ketocoumarin derivative, a cyanine derivative, a merocyanine derivative, a polymethine dye (e.g. an oxanol derivative), an acridine derivative, an azine derivative, a thiazine derivative, an oxazine derivative, an indoline derivative, an azulene derivative, an azlenium derivative, a squarylium derivative, a porphyrin derivative, a tetraphenylporphyrin derivative, a triaryl methane derivative, a tetrabenzoporphyrin derivative, a tetrapyrazinoporphyrazine derivative, a phthalocyanine derivative, a tetraazaporphyrazine derivative, a tetraquinoxalyloporphyrazine derivative, a naphthalocyanine derivative, a subphthalocyanine derivative, a pyrylium derivative, a thiopyrylium derivative, a tetraphyllin derivative, an annulene derivative, a spiropyran derivative, a spirooxazine derivative, a thiospiropyran derivative, a metal arene complex, and an organic ruthenium complex.

The amount of the sensitizer to be added is not particularly limited. For example, the amount is 0.1 to 10 parts by weight, preferably 0.2 to 5 parts by weight, more preferably 0.5 to 2 parts by weight, relative to 100 parts by weight of the total components (A) to (C).

Other Components

In the photocurable material for sealing according to the present invention, other components may be additionally added. Examples of the other components include a sensitizer, a thickening agent, a polymerization inhibitor, a pigment, an adhesiveness improver, an antioxidant agent, a curing accelerator, a filler, a plasticizer, a surfactant, a lubricant and an antistatic agent. Each of these components may be added in a proper amount depending on the intended purpose.

Preparation of Photocurable Material for Sealing

The photocurable material for sealing according to the present invention can be prepared by mixing (A) the oligomer having a weight average molecular weight of 10,000 to 30,000 and having (meth)acryloyl group(s), (B) the (meth)acrylate monomer and (C) the polythiol compound, and optionally (D) the carbodiimide compound, (E) the photo-radical polymerization initiator, (F) the sensitizer, (G) the sensitizer and/or the other components together at room temperature or under heated conditions using a mixing apparatus such as a mixer, a ball mill and a three roll mill. The photocurable material for sealing can also be prepared by dissolving and mixing the photocurable material in a solvent or the like additionally added as a diluent, if necessary. Examples of the solvent to be used as a diluent include: an ester such as ethyl acetate, butyl acetate and isopropyl acetate; a ketone such as acetone, methyl ethyl ketone, methyl isobutyl ketone and cyclohexanone; a cyclic ether such as tetrahydrofuran and dioxane; an amide such as N,N-dimethylformamide; an aromatic hydrocarbon such as toluene; and a halogenated hydrocarbon such as methylene chloride.

Method for Application of Photocurable Material for Sealing

The method for curing the photocurable material for sealing according to the present invention is not particularly limited, and the curing of the photocurable material for sealing can be carried out by irradiating with an energy ray, for example. Examples of the energy ray to be used include light, a radioactive ray and an electromagnetic wave, specifically ultraviolet ray, visible light, infrared ray, α ray, β ray, γ ray and electron beam. From the viewpoints of the workability, productivity, economic performance and the like, ultraviolet ray is preferably used. The time for irradiating with an energy ray may be selected properly depending on the types of the energy ray used. Examples of the light source for ultraviolet ray that can be used include a light source such as super-high pressure mercury, a metal halide light source, a laser and an LED. When α ray, β ray, γ ray, electron beam or the like is used, the curing can be proceeded rapidly without the need of adding the photo-radical polymerization initiator. When ultraviolet ray is used, it is preferred to add the photo-radical polymerization initiator to the photocurable material for sealing according to the present invention.

A case in which the photocurable material for sealing according to the present invention is applied to a gasket in a housing is described below. When the housing includes two components that sandwich the gasket therebetween, the housing according to the present invention can be produced through steps (1) to (4) mentioned below:

(1) applying the photocurable material for sealing uniformly onto a groove (i.e., a gasket application part) in one of the components;

(2) irradiating the applied component with ultraviolet ray or the like to cure the photocurable material for sealing, thereby producing the gasket;

(3) if necessary, integrating a device to be housed in the inside of the housing; and (4) fitting the component into the other component.

In the present invention, the term "housing" refers to a box in which a machine or an electric derive having any function is to be housed and which can protect the device from impact, pressure, electromagnetic wave, water, dusts, light or the like. Specific examples of the housing include: an electronic product such as a mobile phone, a digital camera and a video camera; a home electric appliance such as a refrigerator, an air conditioner and a washing machine; and a precision apparatus such as a camera and a watch. When the sealing material according to the present invention is used in a housing, the invasion of water, pressure, dusts or the like into the housing can be prevented and the above-mentioned protective action of the housing cannot be deteriorated as a whole.

Properties of Sealing Material

The sealing material according to the present invention has a high compression recovery rate, high tensile strength and excellent flexibility, can have low hardness if required, and therefore has excellent sealing properties including air-tightness performance and water-proof performance and undergoes the formation of little surface tacks. It is desired that the hardness of the sealing material is preferably 40 or less, more preferably 30 or less, still more preferably 20 or less, particularly preferably 15 or less, in terms of a value measured using a type-A durometer. When it is intended to reduce the hardness, the content of (B) the (meth)acrylate monomer and/or (C) the polythiol compound is increased to thereby adjust the hardness to a desired value. This matter will be described in more detail in the section of "Examples".

EXAMPLES

Hereinbelow, the present invention is described in detail with reference to Reference examples and Examples. However, these examples are intended to illustrate the invention and are not to be construed to limit the scope of the invention.

[Test Methods]

(1) Tensile Strength at Break, Percentage of Elongation

A 1 mm-thick sheet of a UV-cured resin product was punched into a dumbbell No. 3 shape in accordance with JIS K 6251 to produce a test specimen. A tensile test was carried out under the conditions of a test temperature of 23° C. and a tension speed of 100 m/min, and a tensile strength at break and a percentage of elongation were measured.

Tensile strength at break [MPa]=breaking strength/cross-sectional area of film

Percentage of elongation [%]=(quantity of breaking elongation/reference length [20 mm])×100

(2) Hardness

Sheets of a UV-cured resin product, each having a thickness of about 1 mm, were laminated on each other to produce a specimen having a thickness of about 10 mm and the Shore hardness A of the specimen was measured using a type-A durometer (manufactured by Kobunshi Keiki Co., Ltd.) under the conditions of 23° C. and 50 to 60% RH in accordance with JIS K 6253.

(3) Compression Recovery Performance

Sheets of a UV-cured resin product, each cut into a 25-mm square piece, were laminated on each other to produce a specimen having a thickness of about 5 mm, and the specimen was compressed at a compression ratio of 25% and 50% and then determined on the compression recovery performance under the condition of a test temperature of 70° C. in accordance with JIS K 6253.

(4) Surface Tacks

After curing with irradiation with UV, a 1 mm-thick sheet of the UV-cured resin product was allowed to stand at 23° C. for 2 hours, and the formation of tacks on the irradiated surface was evaluated by finger touch. The evaluation was carried out on the basis of the following criteria:

○: almost no tacks

Δ: a few weak tacks

×: strong tacks (5) Storage Stability

A UV-cured resin was placed in a light-shielded container, and then was allowed to stand under the environment of 40° C. for 2 weeks. The UV-cured resin was determined as to whether or not the state of the UV-cured resin was changed. Further, the viscosity of the UV-cured resin was measured at 0.5 rpm using a Brookfield viscometer, and it was determined as to whether or not the percentage of change in viscosity is within the range of 10% from the initial viscosity.

The storage stability shown in Table 3 was evaluated on the basis of the change in viscosity relative to the initial viscosity and the change in stage after allowing the UV-cured resin to stand at each of the temperatures shown in the table for each of the time periods shown in the table.

○: the rate of change is within the range of 10% from the initial viscosity x: the viscosity was significantly increased and gel formation occurred

Example 1

One hundred parts by weight of a urethane acrylic oligomer A having a weight average molecular weight of 18,000 (UV-3000B; produced by Nippon Synthetic Chemical Industry Co., Ltd.), 60 parts by weight of phenol acrylate (New Frontier PHE-2; produced by Daiichi Yakuhin Kogyo Co., Ltd.) as an acrylic monomer, 8 parts by weight of pentaerythritol tetrakis(3-mercaptobutyrate) having a molecular weight of 544.8 (Karenz MT PE1; produced by Showa Denko K. K.) as a tetrafunctional (secondary) polythiol A, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material according to the present invention.

Example 2

One hundred parts by weight of a urethane acrylic oligomer A having a weight average molecular weight of 18,000 (UV-3000B; produced by Nippon Synthetic Chemical Industry Co., Ltd.), 60 parts by weight of phenol acrylate (New Frontier PHE-2; produced by Daiichi Yakuhin Kogyo Co., Ltd.) as an acrylic monomer, 23 parts by weight of pentaerythritol tetrakis(3-mercaptobutyrate) having a molecular weight of 544.8 (Karenz MT PE1; produced by Showa Denko K. K.) as a tetrafunctional (secondary) polythiol A, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material according to the present invention.

Example 3

One hundred parts by weight of a urethane acrylic oligomer A having a weight average molecular weight of 18,000 (UV-3000B; produced by Nippon Synthetic Chemical Industry Co., Ltd.), 60 parts by weight of phenol acrylate (New Frontier PHE-2; produced by Daiichi Yakuhin Kogyo Co., Ltd.) as an acrylic monomer, 17 parts by weight of pentaerythritol tetrakis(3-mercaptopropionate) having a molecular weight of 488.64 (PEMP; produced by SC Organic Chemical Co., Ltd.) as a tetrafunctional (primary) polythiol B, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material according to the present invention.

Example 4

One hundred parts by weight of a urethane acrylic oligomer A having a weight average molecular weight of 18,000 (UV-3000B; produced by Nippon Synthetic Chemical Industry Co., Ltd.), 60 parts by weight of phenol acrylate (New Frontier PHE-2; produced by Daiichi Yakuhin Kogyo Co., Ltd.) as an acrylic monomer, 17 parts by weight of pentaerythritol tetrakis(3-mercaptobutyrate) having a molecular weight of 544.8 (Karenz MT PE1; produced by Showa Denko K. K.) as a tetrafunctional (secondary) polythiol A, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material according to the present invention.

Example 5

One hundred parts by weight of a urethane acrylic oligomer A having a weight average molecular weight of 18,000 (UV-3000B; produced by Nippon Synthetic Chemical Industry Co., Ltd.), 60 parts by weight of phenol acrylate (New Frontier PHE-2; produced by Daiichi Yakuhin Kogyo Co., Ltd.) as an acrylic monomer, 8 parts by weight of 1,3,5-tris(3-mercaptobutyloxyethyl)-1,3,5-triazine-2,4,6(1H,3H,5H)-trione having a molecular weight of 567.7 (Karenz MT NR1; produced by Showa Denko K. K.) as a trifunctional (secondary) polythiol C, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material according to the present invention.

Example 6

One hundred parts by weight of a urethane acrylic oligomer A having a weight average molecular weight of 18,000 (UV-3000B; produced by Nippon Synthetic Chemical Industry Co., Ltd.), 60 parts by weight of phenol acrylate (New Frontier PHE-2; produced by Daiichi Yakuhin Kogyo Co., Ltd.) as an acrylic monomer, 12 parts by weight of 1,3,5-tris(3-mercaptobutyloxyethyl)-1,3,5-triazine-2,4,6(1H,3H,5H)-trione having a molecular weight of 567.7 (Karenz MT NR1; produced by Showa Denko K. K.) as a trifunctional (secondary) polythiol C, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material according to the present invention.

Example 7

One hundred parts by weight of a urethane acrylic oligomer A having a weight average molecular weight of 18,000 (UV-3000B; produced by Nippon Synthetic Chemical Industry Co., Ltd.), 60 parts by weight of phenol acrylate (New Frontier PHE-2; produced by Daiichi Yakuhin Kogyo Co., Ltd.) as an acrylic monomer, 9 parts by weight of 1,4-bis(3-mercaptobutyryloxy)butane having a molecular weight of 294.4 (Karenz MT BD1; produced by Showa Denko K. K.) as a bifunctional (secondary) polythiol D, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material according to the present invention.

Example 8

One hundred parts by weight of a urethane acrylic oligomer A having a weight average molecular weight of 18,000 (UV-3000B; produced by Nippon Synthetic Chemical Industry Co., Ltd.), 60 parts by weight of phenol acrylate (New Frontier PHE-2; produced by Daiichi Yakuhin Kogyo Co., Ltd.) as an acrylic monomer, 11 parts by weight of dipentaerythritol hexakis(3-mercaptopropionate) having a molecular weight of 783.03 (DPMP; produced by SC Organic Chemical Co., Ltd.) as a hexafunctional (primary) polythiol E, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material according to the present invention.

Comparative Example 1

One hundred parts by weight of a urethane acrylic oligomer A having a weight average molecular weight of 13,000 (KAYARAD UX-3204; produced by NIPPON KAYAKU Co., Ltd.), 60 parts by weight of phenol acrylate (New Frontier PHE-2; produced by Daiichi Yakuhin Kogyo Co., Ltd.) as an acrylic monomer, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material.

Comparative Example 2

One hundred parts by weight of a urethane acrylic oligomer A having a weight average molecular weight of 13,000 (KAYARAD UX-3204; produced by NIPPON KAYAKU Co., Ltd.), 60 parts by weight of phenol acrylate (New Frontier PHE-2; produced by Daiichi Yakuhin Kogyo Co., Ltd.) as an acrylic monomer, 5 parts by weight of pentaerythritol tetrakis(3-mercaptobutyrate) having a molecular weight of 544.8 (Karenz MT PE1; produced by Showa Denko K. K.) as a tetrafunctional (secondary) polythiol A, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material.

Comparative Example 3

One hundred parts by weight of a urethane acrylic oligomer A having a weight average molecular weight of 13,000 (KAYARAD UX-3204; produced by NIPPON KAYAKU Co., Ltd.), 60 parts by weight of phenol acrylate (New Frontier PHE-2; produced by Daiichi Yakuhin Kogyo Co., Ltd.) as an acrylic monomer, 38 parts by weight of pentaerythritol tetrakis(3-mercaptobutyrate) having a molecular weight of 544.8 (Karenz MT PE1; produced by Showa Denko K. K.) as a tetrafunctional (secondary) polythiol A, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material.

Comparative Example 4

One hundred parts by weight of a urethane acrylic oligomer B having a weight average molecular weight 4,500 (UF-8001G; produced by Kyoeisha Co., Ltd.), 60 parts by weight of phenol acrylate (New Frontier PHE-2; produced by Daiichi Yakuhin Kogyo Co., Ltd.) as an acrylic monomer, 7 parts by weight of pentaerythritol tetrakis(3-mercaptobutyrate) having a molecular weight of 544.8 (Karenz MT PE1; produced by Showa Denko K. K.) as a tetrafunctional (secondary) polythiol A, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material.

Comparative Example 5

One hundred parts by weight of a urethane acrylic oligomer B having a weight average molecular weight 4,500 (UF-8001G; produced by Kyoeisha Co., Ltd.), 60 parts by weight of phenol acrylate (New Frontier PHE-2; produced by Daiichi Yakuhin Kogyo Co., Ltd.) as an acrylic monomer, 17 parts by weight of pentaerythritol tetrakis(3-mercaptobutyrate) having a molecular weight of 544.8 (Karenz MT PE1; produced by Showa Denko K. K.) as a tetrafunctional (secondary) polythiol A, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material.

Comparative Example 6

One hundred parts by weight of a urethane acrylic oligomer B having a weight average molecular weight 4,500 (UF-8001G; produced by Kyoeisha Co., Ltd.), 60 parts by weight of phenol acrylate (New Frontier PHE-2; produced by Daiichi Yakuhin Kogyo Co., Ltd.) as an acrylic monomer, 23 parts by weight of pentaerythritol tetrakis(3-mercaptobutyrate) having a molecular weight of 544.8 (Karenz MT PE1; produced by Showa Denko K. K.) as a tetrafunctional (secondary) polythiol A, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material.

Comparative Example 7

One hundred parts by weight of a urethane acrylic oligomer B having a weight average molecular weight 4,500 (UF-8001G; produced by Kyoeisha Co., Ltd.), 4 parts by weight of pentaerythritol tetrakis(3-mercaptobutyrate) having a molecular weight of 544.8 (Karenz MT PE1; produced by Showa Denko K. K.) as a tetrafunctional (secondary) polythiol A, and 8 parts by weight of a viscosity control agent (AEROSIL200; produced by Nippon Aerosil Co., Ltd.) were mixed in vacuo homogeneously in a mixer, then 2 parts by weight of 1-hydroxy-cyclohexyl-phenyl-ketone (IRGACURE 184; produced by BASF Japan Ltd.) as a photopolymerization initiator and 0.02 parts by weight of 1,4-benzenediol (Hydroquinone; produced by Mitsui Chemicals, Inc.) as a stabilizing agent were added to the resultant mixture, and the resultant mixture was mixed homogeneously and defoamed in a mixer, thereby obtaining a photocurable sealing material.

Test Example 1

Each of the photocurable sealing materials obtained in Examples 1 to 8 and Comparative Examples 1 to 7 was shaped into a sheet-like form having a thickness of about 1 mm, and then irradiated with UV light using a UV irradiation device of an electrodeless metal halide lamp type (FOTOCURE TFL-150, manufactured by Tokyo Foton Ltd.; base-lamp distance d=53 mm; integral of light of UV-A wave: about 7000 mJ/cm$^2$) to thereby cure each of the photocurable sealing materials. In this manner, sealing materials were prepared. The integral of light was measured using a UV Power Pack (manufactured by EIT Inc.).

The sealing materials thus obtained were tested on properties thereof by the above-mentioned test methods. The results are shown below.

TABLE 1

| | | Example 1 | Example 2 | Example 3 | Example 4 | Example 5 | Example 6 | Example 7 | Example 8 |
|---|---|---|---|---|---|---|---|---|---|
| Compounding composition | Acryloyl group/Thiol group (ratio of numbers of functional groups) | 100/26 | 100/76 | 100/62 | 100/56 | 100/19 | 100/28 | 100/27 | 100/38 |
| | Expressed by number (n) of thiol groups (n = 6) | | | | | | | | 100/6.3n |
| | Expressed by number (n) of thiol groups (n = 4) | 100/6.6n | 100/18.9n | 100/15.6n | 100/14n | | | | |
| | Expressed by number (n) of thiol groups (n = 3) | | | | | 100/6.3n | 100/9.5n | | |
| | Expressed by number (n) of thiol groups (n = 2) | | | | | | | 100/13.7n | |
| | Urethane acrylic oligomer A | 100 | 100 | 100 | 100 | 100 | 100 | 100 | 100 |
| | Urethane acrylic oligomer B | | | | | | | | |
| | Acrylic monomer | 60 | 60 | 60 | 60 | 60 | 60 | 60 | 60 |
| | Tetrafunctional (secondary) polythiol A | 8 | 23 | | 17 | | | | |
| | Tetrafunctional (primary) polythiol B | | | 17 | | | | | |
| | Trifunctional (secondary) polythiol C | | | | | 8 | 12 | | |
| | Bifunctional (secondary) polythiol D | | | | | | | 9 | |

TABLE 1-continued

|  |  | Example 1 | Example 2 | Example 3 | Example 4 | Example 5 | Example 6 | Example 7 | Example 8 |
|---|---|---|---|---|---|---|---|---|---|
|  | Hexafunctional (primary) polythiol E |  |  |  |  |  |  |  | 11 |
|  | Viscosity control agent | 8 | 8 | 8 | 8 | 8 | 8 | 8 | 8 |
|  | Photopolymerization initiator | 2 | 2 | 2 | 2 | 2 | 2 | 2 | 2 |
|  | Stabilizing agent | 0.02 | 0.02 | 0.02 | 0.02 | 0.02 | 0.02 | 0.01 | 0.02 |
| Values of properties | Tensile strength at break (MPa) | 5.7 | 0.4 | 1.4 | 3.2 | 5.2 | 5.1 | 3.1 | 9.8 |
|  | Percentage of elongation (%) | 1070 | 2000 | 1970 | 1550 | 1000 | 1280 | 1420 | 1370 |
|  | Hardness (Shore A), 23° C. | 36 | 3 | 9 | 15 | 40 | 31 | 22 | 39 |
|  | Compression 25% compression | 98 | 91 | 96 | 96 | 100 | 99 | 98 | 100 |
|  | recovery rate 50% compression (%), | 98 | 74 | 92 | 92 | 100 | 98 | 98 | 100 |
|  | Surface tacks | ○ | ○~Δ | ○ | ○ | ○ | ○ | ○~Δ | ○ |
|  | Storage stability | Good | Good | Slightly bad | Good | Good | Good | Good | Slightly bad |

TABLE 2

|  |  |  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|
| Compounding composition | Acryloyl group/Thiol group (ratio of numbers of functional groups) |  | 100/0 | 100/16 | 100/109 | 100/20 | 100/49 | 100/66 | 100/66 |
|  | Expressed by number (n) of thiol groups (n = 6) |  |  |  |  |  |  |  |  |
|  | Expressed by number (n) of thiol groups (n = 4) |  | 100/0 | 100/4.1n | 100/27.1n | 100/5n | 100/12.2n | 100/16.5n | 100/16.5n |
|  | Expressed by number (n) of thiol groups (n = 3) |  |  |  |  |  |  |  |  |
|  | Expressed by number (n) of thiol groups (n = 2) |  |  |  |  |  |  |  |  |
|  | Urethane acrylic oligomer A |  | 100 | 100 | 100 |  |  |  |  |
|  | Urethane acrylic oligomer B |  |  |  |  | 100 | 100 | 100 | 100 |
|  | Acrylic monomer |  | 60 | 60 | 60 | 60 | 60 | 60 |  |
|  | Tetrafunctional (secondary) polythiol A |  |  | 5 | 33 | 7 | 17 | 23 | 4 |
|  | Tetrafunctional (primary) polythiol B |  |  |  |  |  |  |  |  |
|  | Trifunctional (secondary) polythiol C |  |  |  |  |  |  |  |  |
|  | Bifunctional (secondary) polythiol D |  |  |  |  |  |  |  |  |
|  | Hexafunctional (primary) polythiol E |  |  |  |  |  |  |  |  |
|  | Viscosity control agent |  | 8 | 8 | 8 | 8 | 8 | 8 | 8 |
|  | Photopolymerization initiator |  | 2 | 2 | 2 | 2 | 2 | 2 | 2 |
|  | Stabilizing agent |  | 0.02 | 0.02 | 0.02 | 0.02 | 0.02 | 0.02 | 0.02 |
| Values of properties | Tensile strength at break (MPa) |  | 2.9 | 4.5 | n.d. | 8.2 | 4.7 | 4.7 | 26.8 |
|  | Percentage of elongation (%) |  | 250 | 860 | n.d. | 290 | 320 | 400 | 210 |
|  | Hardness (Shore A), 23° C. |  | 45 | 43 | n.d. | 71 | 60 | 56 | 91 |
|  | Compression recovery | 25% compression | 100 | 100 | n.d. | 99 | 100 | 100 | 100 |
|  | rate (%), | 50% compression | 99 | 98 | n.d. | 99 | 99 | 99 | Broken |
|  | Surface tacks |  | ○ | ○ | x | ○ | ○ | ○ | ○ |
|  | Storage stability |  | Good | Good | — | Good | Good | Good | Good |

The sealing materials according to the present invention obtained in Examples 1 to 8 had higher compression recovery rates, higher tensile strength, more superior flexibility and lower hardness compared with those of the sealing materials obtained in Comparative Examples. By adding a thiol component, good adhesion performance, low surface tack formation and also good storage stability were achieved.

The experiments in Comparative Examples 4 to 7 followed the experiments shown in Table 2 in Patent Document 7 so as to be made similar to each other as possible. However, in all of the sealing materials obtained in the Comparative Examples 4 to 7, hardness values were as extremely high as 50 or more and the percentages of elongation were low. In Comparative Example 6, the content of the thiol compound was increased for the purpose of reducing the hardness as possible. Nevertheless, the hardness value was more than 50 and therefore the sealing material was not suitable for use as a sealing material for a housing.

As shown in Comparative Examples 1 and 2, in the case in which no polythiol compound was added and the case in which a polythiol compound was added in such an amount that the (acryloyl group)/(thiol group) ratio was less than 100/5n, the hardness values were high, satisfactory levels of softness were not achieved, and the percentages of elongation were low. On the contrary, as shown in Comparative Example 3, in the case in which a polythiol compound was added in such an amount that the (acryloyl group)/(thiol group) ratio was more than 100/25n, a satisfactory level of aggregation force was not achieved and the film properties could not be measured.

Examples 9 to 11

The same procedure as in Example 4 was carried out, except that a polycarbodiimide compound (Elastostab H01; produced by Nisshinbo Chemical Inc.) was added in each of the amounts shown in Table 3 below. In this manner, photocurable materials for sealing according to the present invention were obtained.

TABLE 3

|  |  | Example 4 | Example 9 | Example 10 | Example 11 |
|---|---|---|---|---|---|
| Compounding composition | Acryloyl group/Thiol group (ratio of numbers of functional groups) | 100/56 | 100/56 | 100/56 | 100/56 |
|  | Expressed by number (n) of thiol groups (n = 4) | 100/14n | 100/14n | 100/14n | 100/14n |
|  | Urethane acrylic oligomer A | 100 | 100 | 100 | 100 |
|  | Acrylic monomer | 60 | 60 | 60 | 60 |
|  | Tetrafunctional (secondary) polythiol A | 17 | 17 | 17 | 17 |
|  | Carbodiimide compound |  | 1.7 | 5 | 8.3 |
|  | Viscosity control agent | 8 | 8 | 8 | 8 |
|  | Photopolymerization initiator | 2 | 2 | 2 | 2 |
|  | Stabilizing agent | 0.02 | 0.02 | 0.02 | 0.02 |
| Values of properties | Tensile strength at break (MPa) | 3.2 | 3.2 | 3.2 | 3.2 |
|  | Percentage of elongation (%) | 1550 | 1550 | 1550 | 1600 |
|  | Hardness (Shore A), 23° C. | 15 | 15 | 15 | 15 |
|  | Compression recovery rate (%), 25% compression | 96 | 96 | 96 | 96 |
|  | 50% compression | 92 | 92 | 92 | 92 |
|  | Surface tacks | ○~Δ | ○~Δ | ○~Δ | ○~Δ |
|  | Storage stability |  |  |  |  |
|  | 40° C. 2 weeks | ○ | ○ | ○ | ○ |
|  | 40° C. 1 month | x | ○ | ○ | ○ |
|  | 23° C. 1 month | ○ | ○ | ○ | ○ |
|  | 23° C. 3 months | x | ○ | ○ | ○ |
|  | 23° C. 6 months | — | ○ | ○ | ○ |

This experiment demonstrated that storage stability was improved significantly when a carbodiimide compound was added. For example, when the photocurable material for sealing in Example 4 was stored at 23° C., the photocurable material was stable for 1 month, but turned into a gel thereafter. In the photocurable materials for sealing in Examples 9 to 11 in each of which a carbodiimide compound was added, the photocurable materials were stable for 6 months or longer and had excellent storage stability. The temperature 23° C. is the upper limit temperature for the storage in a cold and dark place. Therefore, the stability determined at this temperature corresponds to the storage stability in a cold and dark place.

INDUSTRIAL APPLICABILITY

According to the present invention, it becomes possible to provide a sealing material that has a high compression recovery rate, high tensile strength and excellent flexibility, can have low hardness if required, and therefore has excellent sealing properties including air-tightness performance and water-proof performance and undergoes the formation of little surface tacks. It becomes also possible to provide a photocurable material for sealing that can be deeply cured easily and instantly to produce the above-mentioned sealing material and has storage stability.

The invention claimed is:

1. A photocurable material for sealing, comprising (A) an oligomer having a weight average molecular weight of 10,000 to 30,000 and having a (meth)acryloyl group, (B) a (meth)acrylate monomer, and (C) a polythiol compound,
wherein the (meth)acrylate (B) is contained in an amount of 5 to 100 parts by weight relative to 100 parts by weight of (A) the oligomer having a (meth)acryloyl group, and the ratio of the number of (meth)acryloyl groups contained in both of (A) the oligomer having a (meth)acryloyl group and (B) the (meth)acrylate monomer to the number of thiol groups contained in (C) the polythiol compound present in the photocurable material for sealing is 100:5n to 100:25n, but not inclusive of 100:5n, wherein n is the number of thiol groups per molecule of the polythiol compound.

2. The photocurable material for sealing according to claim 1, wherein a carbodiimide compound is contained in an amount of 0.1 to 15 parts by weight relative to 100 parts by weight of (A) the oligomer having a (meth)acryloyl group.

3. The photocurable material for sealing according to claim 1, wherein (C) the polythiol compound has 2 to 6 thiol groups per molecule and each of the thiol groups is a secondary thiol group.

4. The photocurable material for sealing according to claim 1, wherein (C) the polythiol compound is an ester produced from a polyhydric alcohol having 2 to 6 hydroxy groups and β-mercaptobutanoic acid.

5. The photocurable material for sealing according to claim 1, wherein (B) the (meth)acrylate monomer is a monofunctional (meth)acrylate, a polyfunctional (meth)acrylate or a combination thereof.

6. The photocurable material for sealing according to claim 1, wherein (A) the oligomer having a (meth)acryloyl group is at least one selected from the group consisting of a urethane-type (meth)acrylate oligomer, a polyester-type (meth)acrylate oligomer, a polyether-type (meth)acrylate oligomer, an epoxy-type (meth)acrylate oligomer, a conjugated-diene-polymer-type (meth)acrylate oligomer and hydrogenated products thereof.

7. The photocurable material for sealing according to claim 1, wherein a photo-radical polymerization initiator and/or a viscosity control agent is additionally contained.

8. A sealing method comprising photocuring the photocurable material for sealing according to claim 1.

9. A sealing material produced by photocuring the photocurable material for sealing as recited in claim 1.

10. A housing a sealing material produced by photocuring the photocurable material for sealing according to claim 1.

* * * * *